(12) United States Patent
Stafford et al.

(10) Patent No.: US 8,088,938 B2
(45) Date of Patent: Jan. 3, 2012

(54) LOW DECOMPOSITION STORAGE OF A TANTALUM PRECURSOR

(75) Inventors: Nathan Stafford, Wilmington, DE (US); Christian Dussarrat, Wilmington, DE (US); Olivier Letessier, San Jose, CA (US); Ravi K. Laxman, San Jose, CA (US)

(73) Assignees: Air Liquide Electronics U.S. LP, Dallas, TX (US); American Air Liquide, Inc., Fremont, CA (US)

( * ) Notice: Subject to any disclaimer, the term of this patent is extended or adjusted under 35 U.S.C. 154(b) by 407 days.

(21) Appl. No.: 12/340,888

(22) Filed: Dec. 22, 2008

(65) Prior Publication Data

US 2009/0163732 A1    Jun. 25, 2009

Related U.S. Application Data

(60) Provisional application No. 61/015,905, filed on Dec. 21, 2007, provisional application No. 61/015,916, filed on Dec. 21, 2007.

(51) Int. Cl.
*C07F 9/00* (2006.01)
*B01J 19/00* (2006.01)
(52) U.S. Cl. .............................. 556/42; 422/39; 422/40
(58) Field of Classification Search .................. 556/42; 422/39, 40
See application file for complete search history.

(56) References Cited

FOREIGN PATENT DOCUMENTS

| EP | 1 865 091 | 12/2007 |
|---|---|---|
| WO | WO 2004 007793 | 1/2004 |
| WO | WO 2007 115000 | 10/2007 |

OTHER PUBLICATIONS

Bradley D.C., et al. "Metallo-organic compounds containing metal-nitrogen bonds". Canadian Journal of Chemistry (1962), 40, 1355-60.
International Search Report for PCT/IB2008/055495 and Written Opinion.
Maeng, W. et al. "Atomic layer deposition of Ta-based thin films: Reactions of alkylamide precursor with various reactants." Journal of Vacuum Science and Technology: Part B, AVS/AIP, vol. 24, No. 5, Sep. 18, 2006, pp. 2276-2281.
Koyoma, H. et al. "Thermal properties of various Ta precursors used in chemical vapor deposition of tantalum pentoxide." Japan Journal of Applied Physics, vol. 33, Nov. 1994, pp. 6291-6298.
Winter, C. "The chemical vapor deposition of metal nitride films using modern metalorganic precursors." Aldrichimica ACTA, vol. 33, No. 1, 2000, pp. 2-12.
IPRP for related PCT/IB2008/055495, (2009).

*Primary Examiner* — Porfirio Nazario Gonzalez
(74) *Attorney, Agent, or Firm* — Patricia E. McQueeney

(57) ABSTRACT

Methods of storing a precursor which decreases the precursor decomposition rate. A vessel is provided, where the vessel has an outer surface made of a first material, and an inner surface made of a second material. The first and second materials are different. A tantalum containing precursor is placed inside the vessel, and the vessel is heated to a temperature between 60° C. and 150° C. At least part of the precursor is withdrawn from the vessel.

19 Claims, 5 Drawing Sheets

LOW DECOMPOSITION STORAGE OF A TANTALUM PRECURSOR

CROSS REFERENCE TO RELATED APPLICATIONS

The present application claims the benefit of U.S. Provisional Application Ser. Nos. 60/015,905 and 60/015,916, both filed Dec. 21, 2007, herein incorporated by reference in its entirety for all purposes.

BACKGROUND

1. Field of the Invention

This invention relates generally to the fields of semiconductor, photovoltaic, flat panel, or LCD-TFT device fabrication.

2. Background of the Invention

As manufacturing processes in the semiconductor, photovoltaic, flat panel and LCD-TFT industries continue to develop and evolve, different materials are constantly under evaluation for use in these processes. For instance, many different organometallic molecules (or "precursors") are being proposed as metal sources for depositing metal, metal oxide, and metal nitride layers for semiconductor manufacture. Typically, these materials are used for depositing thin film layers on substrates. Depositions of these materials may be carried out by several methods, including: chemical vapor deposition (CVD), plasma enhanced chemical vapor deposition (PECVD), physical vapor deposition (PVD), atomic layer deposition (ALD) or plasma enhanced atomic layer deposition (PEALD). These precursors need particular physical and thermal properties to be used in a given semiconductor manufacturing process. For example, the precursors need to have high volatility, reactivity, and thermal stability.

One type of film being deposited for manufacturing integrated circuits is tantalum nitride (TaN), which is generally formed by using a CVD process (or PECVD) with the precursor "PDMAT" (pentakis(dimethylamido) tantalum (V)=$Ta(NMe_2)_5$). Other known precursors for the deposition of tantalum nitride include "PDEAT" (pentakis(diethlyamino)tantalum), and "PEMAT" pentakis(N-methlyethylamino)tantalum. These precursors may be reacted with $NH_3$ to produce a highly uniform films with low resistivity, which may be used as a barrier layer to prevent copper (Cu) metallization.

However, there are certain challenges associated with the use and supply of precursor materials. For instance, since the precursor is delivered to the deposition chamber in the gas phase, a precursor must have a sufficient vapor pressure to provide enough material for uniform deposition. However, most of the precursors for these films are solids at room temperature where they have low vapor pressures. This then requires the delivery temperature of the precursor to be higher than room temperature. For example with PDMAT, this temperature is often approximately 75° C. Thus, an important property of the precursor is the thermal stability of the precursor at this elevated temperature. If a precursor decomposes prior to deposition, the resulting films are often contaminated or non-uniform. In addition to this thermal stability, material compatibility is often an issue. A precursor must be compatible with the material that the chemical is delivered or stored in. In addition, the precursors are often delivered with a carrier gas such as argon (Ar) or nitrogen ($N_2$) often at reduced pressures.

Consequently, there exists a need for methods and systems which decrease the possibility of precursor decomposition during storage prior to deposition.

BRIEF SUMMARY

The invention provides novel methods and apparatus for the storage of tantalum based precursors. In an embodiment, a method for storing a precursor which decreases the precursor decomposition rate comprises providing a vessel, which itself comprises an outer surface made of a first material, and an inner surface made of a second material. The vessel defines an internal volume, and the outer surface material is not the same as the inner surface material. A precursor is introduced into the vessel, where the precursor is of the general formula:

$$Ta(NR^1R^2)_x;$$

where $R^1$ and $R^2$ are independently selected among C1-C4 alkyl groups, and x is 4 or 5. While in the vessel, at least part of the precursor is in direct physical contact with at least part of the inner surface material. The vessel is heated to a temperature between about 60° C. and about 150° C., and at least part of the precursor is withdrawn from the vessel.

Other embodiments of the current invention may include, without limitation, one or more of the following features:
- withdrawing at least part of the precursor from the vessel, wherein the amount of precursor in the vessel has decomposed less than 7.0%, by weight, between the time the precursor is introduced into the vessel, and the time the precursor is withdrawn from the vessel;
- withdrawing at least part of the precursor from the vessel, wherein the amount of precursor in the vessel has decomposed less than 5.0%, by weight, between the time the precursor is introduced into the vessel, and the time the precursor is withdrawn from the vessel;
- withdrawing at least part of the precursor from the vessel, wherein the amount of precursor in the vessel has decomposed less than 1.0%, by weight, between the time the precursor is introduced into the vessel, and the time the precursor is withdrawn from the vessel;
- allowing at least 14 days to pass between the time the precursor is introduced into the vessel, and the time when the precursor is withdrawn from the vessel;
- introducing a carrier gas to the vessel, where the carrier gas is one of nitrogen, argon, helium, dimethylamine (DMA), diethylamine (DEA), and mixtures thereof;
- introducing the carrier gas into the vessel to aid in withdrawing the precursor;
- introducing the carrier gas into the vessel to act as a head gas for storage of the precursor in the vessel;
- withdrawing the precursor from the from the vessel at pressure between about 1 mTorr and about 760 Torr, preferably between about 1 Torr and about 10 Torr, and more preferably at a pressure of about 0.5 Torr.
- heating the vessel to a temperature between about 60° C. and about 100° C., and preferably to about 75° C.;
- the precursor is at least one of pentakis(dimethyl)amino tantalum (PDMAT), pentakis(diethlyamino)tantalum (PDEAT), and pentakis(N-methlyethylamino)tantalum (PEMAT);
- the outer surface material is stainless steel, or a stainless steel alloy;
- the inner surface material is selected from glass, silicon, silicon dioxide, silicon carbide, quartz, titanium oxide, titanium nitride PFTE, tantalum oxide, and tantalum nitride.

providing a plurality of storage surfaces disposed within the internal volume of the vessel; and introducing the precursor such that at least part of the precursor is in direct physical contact with at least part of the storage surfaces, wherein, the storage surfaces are made of a material different from that of the outer surface material.

the vessel is a bubbler type vessel; and the vessel is a precursor storage container.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DESCRIPTION OF PREFERRED EMBODIMENTS

Generally, the invention provides novel methods and apparatus for storing tantalum based precursors with a decreased decomposition rate. In an embodiment, a method for storing a precursor which decreases the precursor decomposition rate comprises providing a vessel, which itself comprises an outer surface made of a first material, and an inner surface made of a second material. The vessel defines an internal volume, and the outer surface material is not the same as the inner surface material. A precursor is introduced into the vessel, where the precursor is of the general formula:

$$Ta(NR^1R^2)_x;$$

where $R^1$ and $R^2$ are independently selected among C1-C4 alkyl groups, and x is 4 or 5. While in the vessel, at least part of the precursor is in direct physical contact with at least part of the inner surface material. The vessel is heated to a temperature between about 60° C. and about 150° C., and at least part of the precursor is withdrawn from the vessel.

In some embodiments, the tantalum containing precursor is $Ta(NMe_2)_5$ (PDMAT) which is a precursor material used for the deposition of tantalum oxide (e.g. $Ta_2O_5$) and tantalum nitride (e.g. TaN) films. In other embodiments the precursor may be $Ta[N(CH_2CH_3)_2]_5$ (PDEAT), or $Ta[N(CH_2CH_3)(CH_3)]_5$ (PEMAT). Typically the deposition process requires that these materials be delivered to the reaction chamber in the gas phase (e.g for use in a CVD or ALD type process). However, as these precursors have low vapor pressures at room temperature, it may be necessary to use them at an elevated temperature such that the materials then exhibit a vapor pressure sufficient to deliver enough material to the deposition reaction chamber to achieve the required layer growth rate. For example, PDMAT has vapor pressure of about 0.2 Torr at 80° C., and about 1 Torr at about 100° C. Generally, precursors such as these are supplied and stored in canisters made of materials such as 316 L stainless steel.

However, it has been determined that these precursors are unstable, exhibiting increased decomposition, in the presence of stainless steel and at temperatures around 75° C. One possible mechanism for the decomposition of PDMAT is according to the formula:

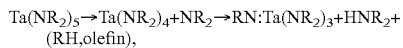

where R may independently be =($NMe_2$, $NEt_2$, $NPr_2$, $NBU_2$, and NMeBu). While this decomposition is complicated, it is clear that a change (over time) in the % C, % N or % H observed would be an indication of decomposition at least because of the release of $HNR_2$. Likewise, lack of a change (over time) in the % C, % N, or % H would be indicative of a lack of, or of a very low, decomposition rate.

Figure 1:
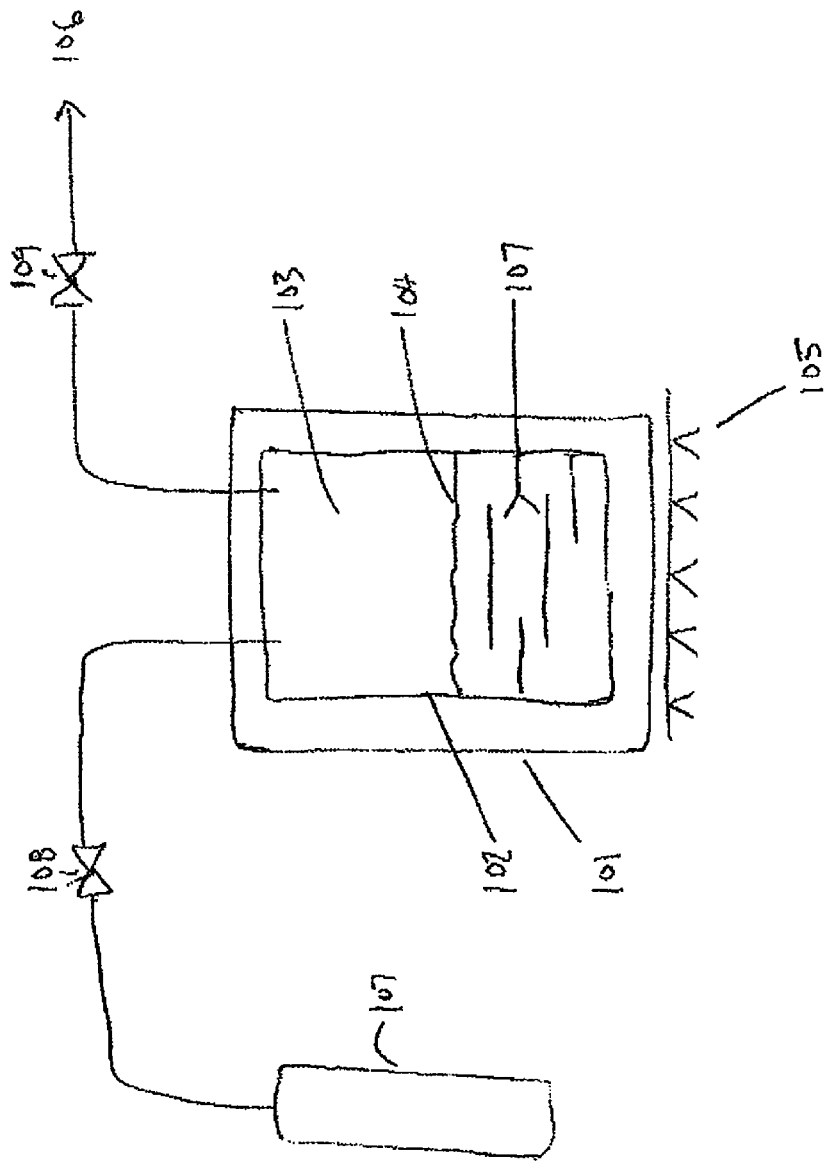
FIG. 1 illustrates a schematic representation according to one embodiment of the current invention.

Referring now to FIG. 1, embodiments of the method and apparatus according to the current invention are described hereafter. A precursor storage vessel 100 is shown. The storage vessel 100 has at least one outer surface 101 made of a first material, and at least one inner surface 102 made of a second material. The material of the inner surface 102 and the outer surface 101 are not the same. In some embodiments, the outer surface material may be stainless steel (e.g. 316 L type stainless steel). In some embodiments, the inner surface 102 material may be one or more of glass, silicon, silicon dioxide, silicon carbide, quartz, titanium oxide, titanium nitride PFTE, tantalum oxide, and tantalum nitride. The inner surface material may be applied conventionally as a coating, or it may be supplied as an insert type material, as would be known to one of skill in the art.

The vessel also defines an internal volume 103, into which a precursor 104 may be introduced for storage. The precursor 104 is situated inside the internal volume 103 of the storage vessel 100 such that at least part of the precursor 104 is in direct physical contact (e.g. touching) with the inner surface 102.

In some embodiments, the vessel 100 may be heated to a temperature between about 60° C. and about 150° C. with heating element 105. Heating element 105 may be a conventional heating element, such as a resistance header or an induction heater, as would be known of one of skill in the art.

At least part of the precursor 104 is removed from the vessel 100, normally to be sent to a manufacturing tool deposition chamber 106 for use in a deposition process. In some embodiments, the deposition process may be one of chemical vapor deposition (CVD), plasma enhanced chemical vapor deposition (PECVD), physical vapor deposition (PVD), atomic layer deposition (ALD) or plasma enhanced atomic layer deposition (PEALD).

In some embodiments a carrier gas is introduced into the vessel 100 from a carrier gas supply source. The carrier gas may be flowed through the vessel 100 to carry the vapor phase of the precursor 104 to the deposition chamber 106. In some embodiments, the carrier gas may be nitrogen, argon, helium, or mixtures of these. In some embodiments, the carrier gas may also be dimethylamine (DMA) or diethylamine (DEA), or mixtures of these with each other or nitrogen, argon, or helium. Generally then carrier gas may be a gas mixture comprising 0% to 100% dimethylamine or diethylamine. The carrier 12 gas may be introduced from the carrier gas source 107 at pressures between about 1 mTorr and about 760 Torr, and at various flow rates (e.g. between about 100 sccm and about 2000 sccm).

In some embodiments, a carrier gas type mixture containing dimethylamine or diethylamine may also be used as a head gas for storage of the precursor 104. In these embodiments, the mixture may be added to the vessel 100 so that precursor 104 is then stored under a blanket of dimethylamine or diethylamine (e.g. in an atmosphere containing dimethylamine or diethylamine). Whether dimethylamine or diethylamine are used in a carrier gas or in a head gas, the addition of these would shift the equilibrium of the precursor's decomposition reaction towards the nondecomposed molecule, thereby allowing for a decrease in the decomposition rate of the precursor 104 stored in the storage vessel 100.

In some embodiments, a period of time passes between when the precursor 104 is introduced into the internal volume 103 of the storage vessel 100, and when at least part of the precursor 104 is withdrawn (for instance, to be sent to deposition chamber 106). This period of time may correspond to a shipping or transit time when the storage vessel 100 is transferred from a chemical manufacturer or supplier's site to an end user or customers' site, or this period of time may correspond to a period of inactivity when deposition chamber 106 is inactive. In some embodiments, this time period may be between 1 day and 30 days, or in some embodiments the time period may be greater than 14 days. During this time period, the precursor 104 stored in the vessel 100 exhibits a decreased decomposition rate. In some embodiments, the precursor 104 has decomposed less than 7.0%, as evidenced by weight change, during the time between when the precursor 104 is introduced into the storage vessel, and the time when the precursor is withdrawn. In some embodiments, the amount of decomposition is less than 5.0%, by weight, or less than 1.0%, by weight.

In some embodiments, a plurality of storage surfaces 107 may be provided in the internal volume 103 of the storage vessel 100. These storage surfaces 107 may be made of a non-stainless steel material, for instance, they may be made of the same material as the inner surface 102. Storage surfaces 107 may be of varying shapes and configurations, but generally when precursor 104 is disposed on storage surfaces 107, the overall surface area of the precursor 104 that is exposed to either the carrier gas or head gas, is increased, thereby allowing a greater rate of precursor withdraw from the storage vessel 100. In some embodiments storage surfaces may be flat surfaces, such as disks or trays, which are inserted into the internal volume 103 of the storage vessel 100. In some embodiments the storage surfaces may machined as part of, or affixed to the inner surface 102 of the storage vessel 100.

In some embodiments, the storage vessel 100 may be a bubbler type vessel. Generally, a bubbler vessel is described as a stainless steel canister (most likely 316 L electropolished ultrahigh purity) in which there is an inlet tube for the carrier gas and an outlet tube for the carrier gas+precursor vapors to exit (inlet and outlet tubes may also have a valves (108, 109) for opening and closing the flow of gas). The inlet tube may be heated to the same temperature as the canister and the outlet tube may be heated to higher than the canister. Bubbler type vessels are offered by companies such as Air Liquide and are conventionally referred to as precursor bubblers. These vessels are typically air tight so as to prevent air exposure to the precursor, and generally have volumes between about 200 mL and about 10 L. In some embodiments, the storage vessel 100 may be a precursor storage container. Generally, precursor storage containers are similar to bubblers in that they are stainless steel canisters with inlets and outlets, suitable to store a precursor. Precursor storage containers may differ from bubblers in that bubblers are typically semi-permanent components in precursor delivery systems (e.g. a component affixed at a customer location), while precursor storage containers are intended to be transferred between locations (e.g. between a chemical supplier's facility and the customer facility).

EXAMPLES

The following non-limiting examples are provided to further illustrate embodiments of the invention. However, the examples are not intended to be all inclusive and are not intended to limit the scope of the inventions described herein.

Example 1

Figure 2:
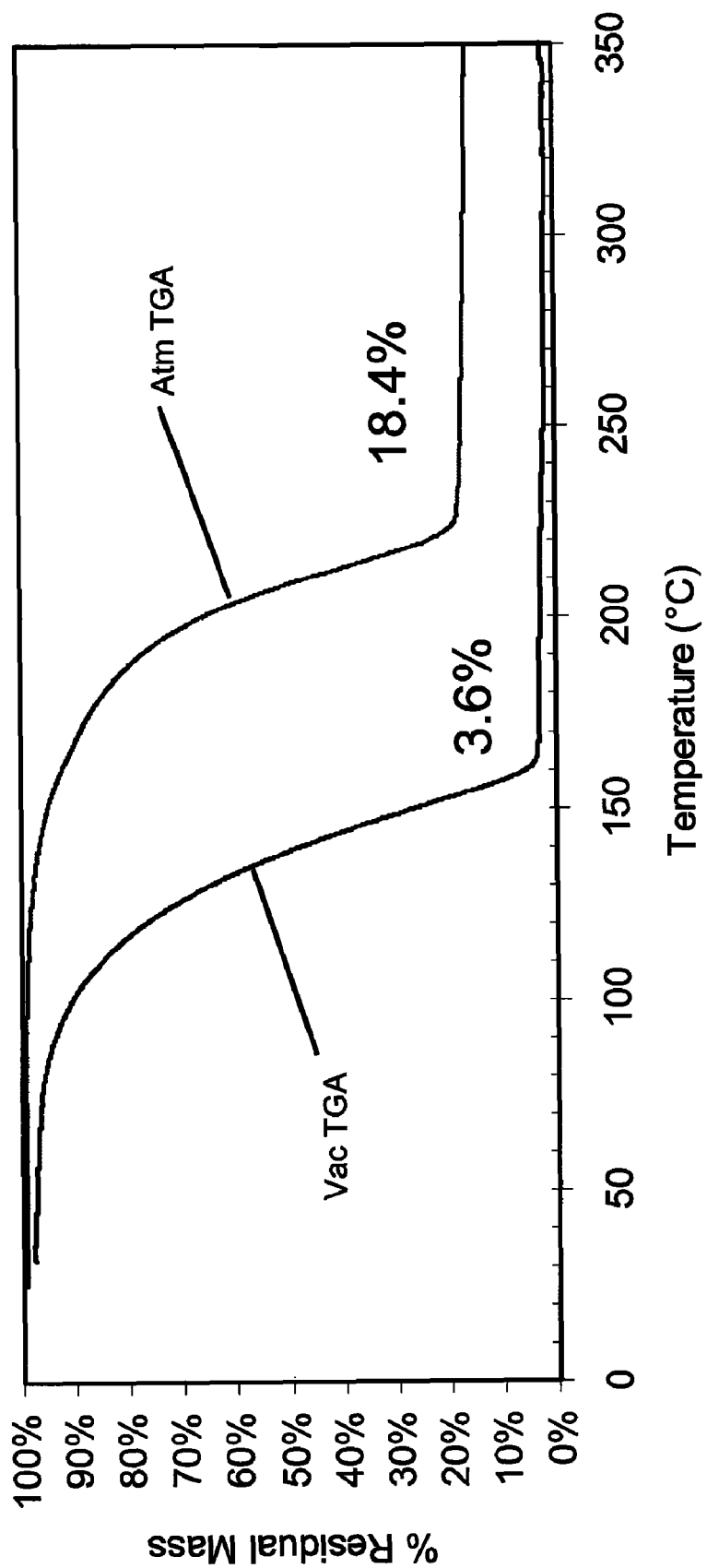
FIG. 2 illustrates experimental data relating to a precursor material.

A thermal gravimetric analysis (TGA) of a PDMAT sample (between about 0.02 and about 0.05 grams) was conducted at atmospheric (~760 Torr) and sub-atmospheric conditions (~1 Torr) over a 1 hour period. The sample was heated from 25° C. to 500° C., at a rate of 10° C./min, with a flow rate of $N_2$ carrier gas of 130 sccm. The results of this analysis are shown graphically in FIG. 2. PDMAT is seen to have strong limitations in thermal stability, and evaporation with limited amounts of residue is best achieved under sub-atmospheric conditions.

Example 2

Samples of PDMAT were placed in a standard stainless steel vessel (vessel 1), and a glass lined vessel (vessel 2). Both vessels were sealed air tight, and heated to and maintained at a temperature of about 75° C. After 2 weeks, the samples were removed and subjected to an elemental analysis (~0.05% relative error), the results of which were compared to a base line sample of PDMAT which was not treated. It was determined that the sample in vessel 2 underwent little to no decomposition, while the sample in vessel 1 exhibited approximately a 7.5% relative change as compared to the baseline sample. The results of the analysis are shown in Table 1:

TABLE 1

| Sample | % C | % H | % N |
|---|---|---|---|
| Baseline sample | 29.51 | 7.04 | 16.23 |
| Vessel 1, heated, sealed, 2 weeks | 27.33 | 6.39 | 14.46 |
| Vessel 2, heated, sealed, 2 weeks | 29.96 | 7.26 | 16.74 |

Example 3

Samples of PDMAT were placed in vessels and heated over a 2 week period as in Example 2. Once a day, any volatiles were removed from the vessel with a vacuum pump. After 2 weeks, the samples were removed and subjected to an elemental analysis (~0.05% relative error), the results of which were compared to the baseline sample of PDMAT from Example 2. It was determined that the sample in vessel 2 underwent little to no decomposition, while the sample in vessel 1 exhibited approximately a 13% relative change as compared to the baseline sample. Comparing the results in Example 1, with those in Example 2, it was determined that the removal of the volatiles (e.g. NHMe$_2$) enhances the overall decomposition rate. The results of this analysis are shown in Table 2:

TABLE 2

| Sample | % C | % H | % N |
|---|---|---|---|
| Baseline sample | 29.51 | 7.04 | 16.23 |
| Vessel 1, heated, daily evacuation, 2 weeks | 26.17 | 6.14 | 14.73 |
| Vessel 2, heated, daily evacuation, 2 weeks | 28.63 | 6.77 | 16.08 |

Example 4

Figure 3:
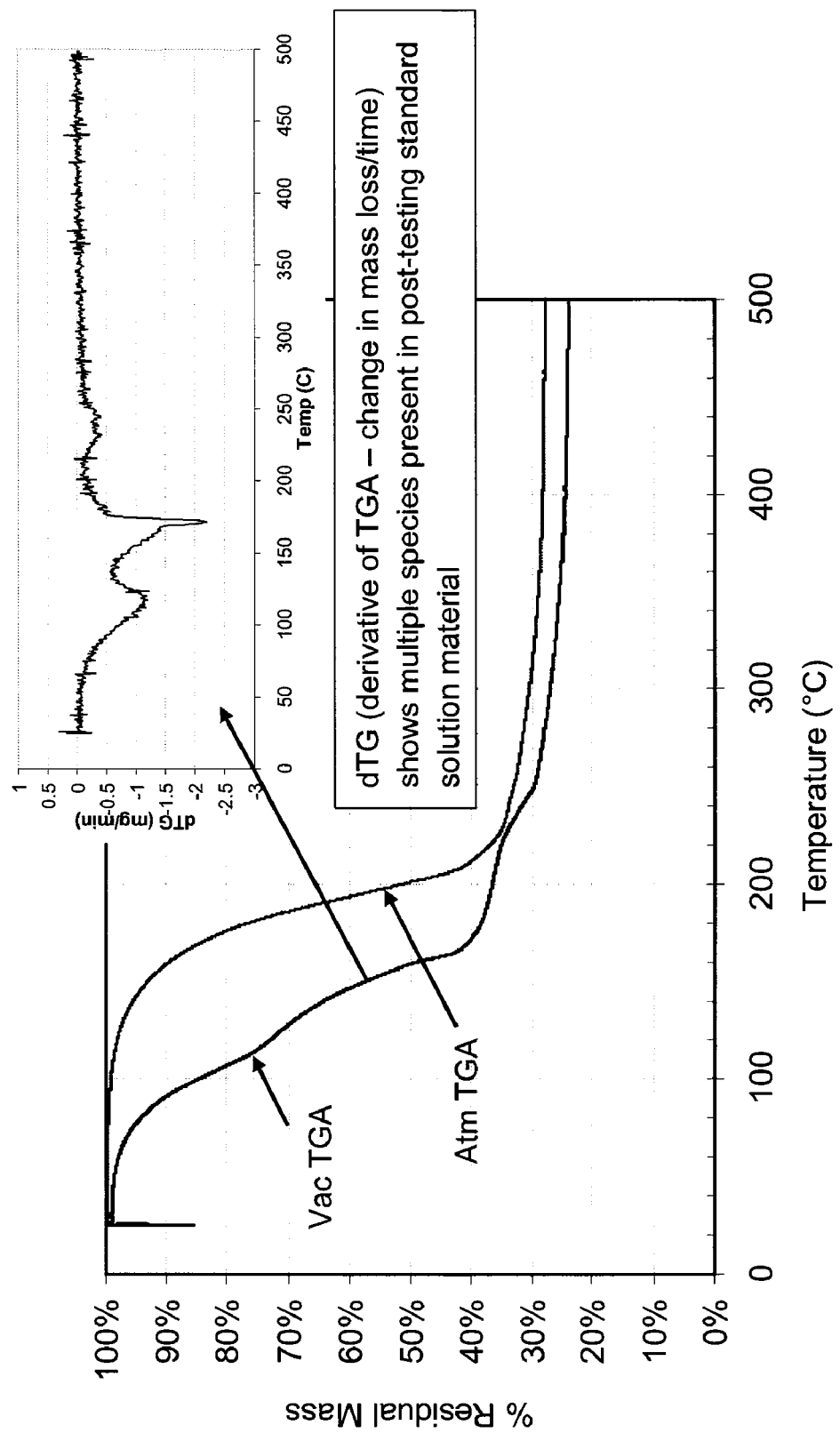
FIG. 3 also illustrates experimental data relating to a precursor material.
Figure 4:
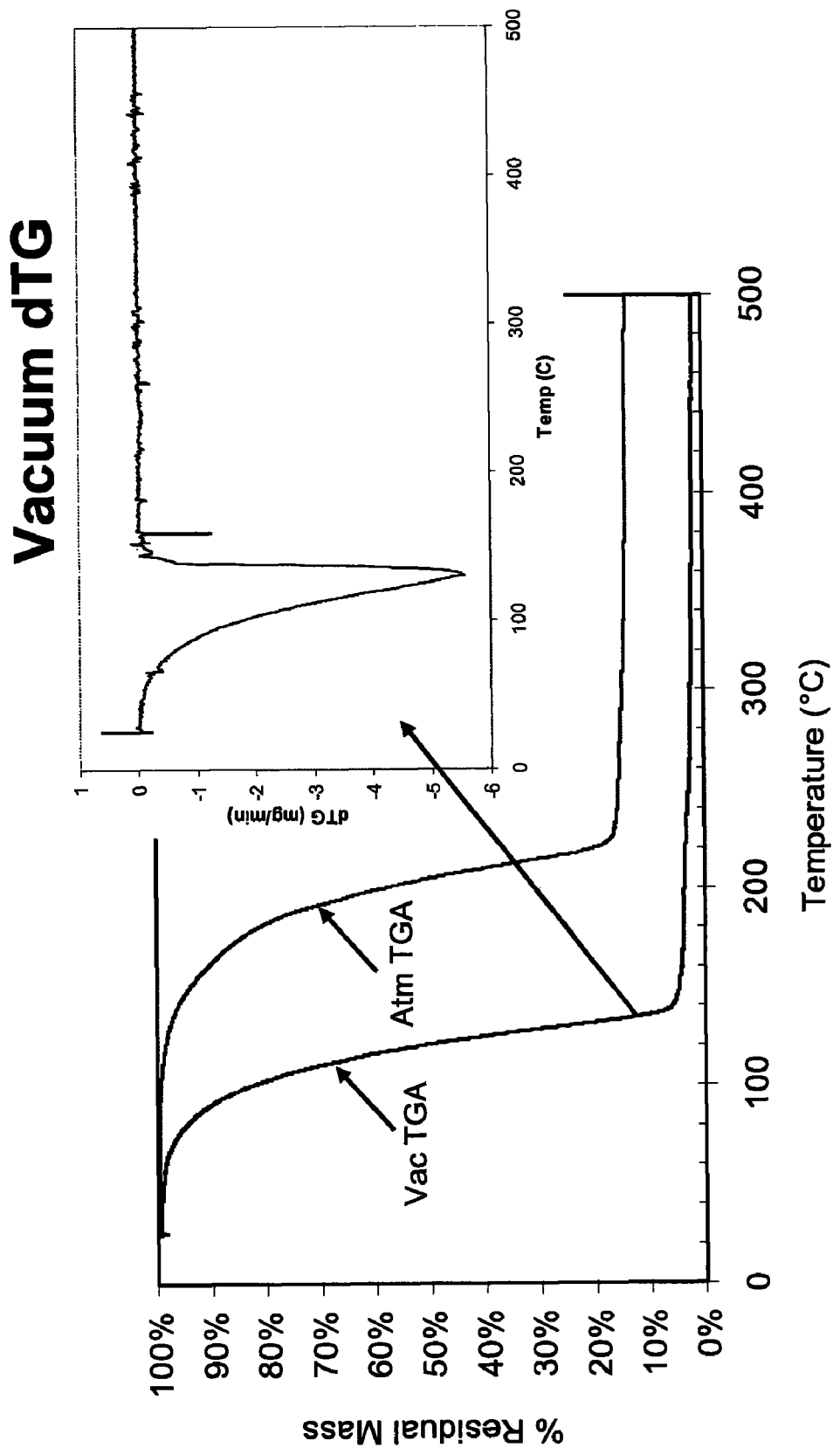
FIG. 4 illustrates experimental data, obtained according to one embodiment of the current invention.

Samples of PDMAT were placed in vessels as in Example 2. These samples were heated and maintained at a temperature of about 75° C., and volatiles were continuously evacuated with a vacuum pump over a period of 2 days. After 2 days, the samples were removed and analyzed under a TGA analysis as in Example 1. A derivative test, "dTG" was also performed on the samples under sub-atmospheric conditions. The sample in vessel 1 (i.e. stainless steel vessel) exhibited decomposition characteristics and did not give a clean evaporation. From the dTG test, it appeared that multiple species were present in the sample. The sample in vessel 2 (i.e. glass lined vessel) exhibited little to no decomposition, and the dTG test showed little evidence of the presence of multiple species. The results for vessels 1 and 2 are shown in FIGS. 3 and 4, respectively.

Example 5

Figure 5:
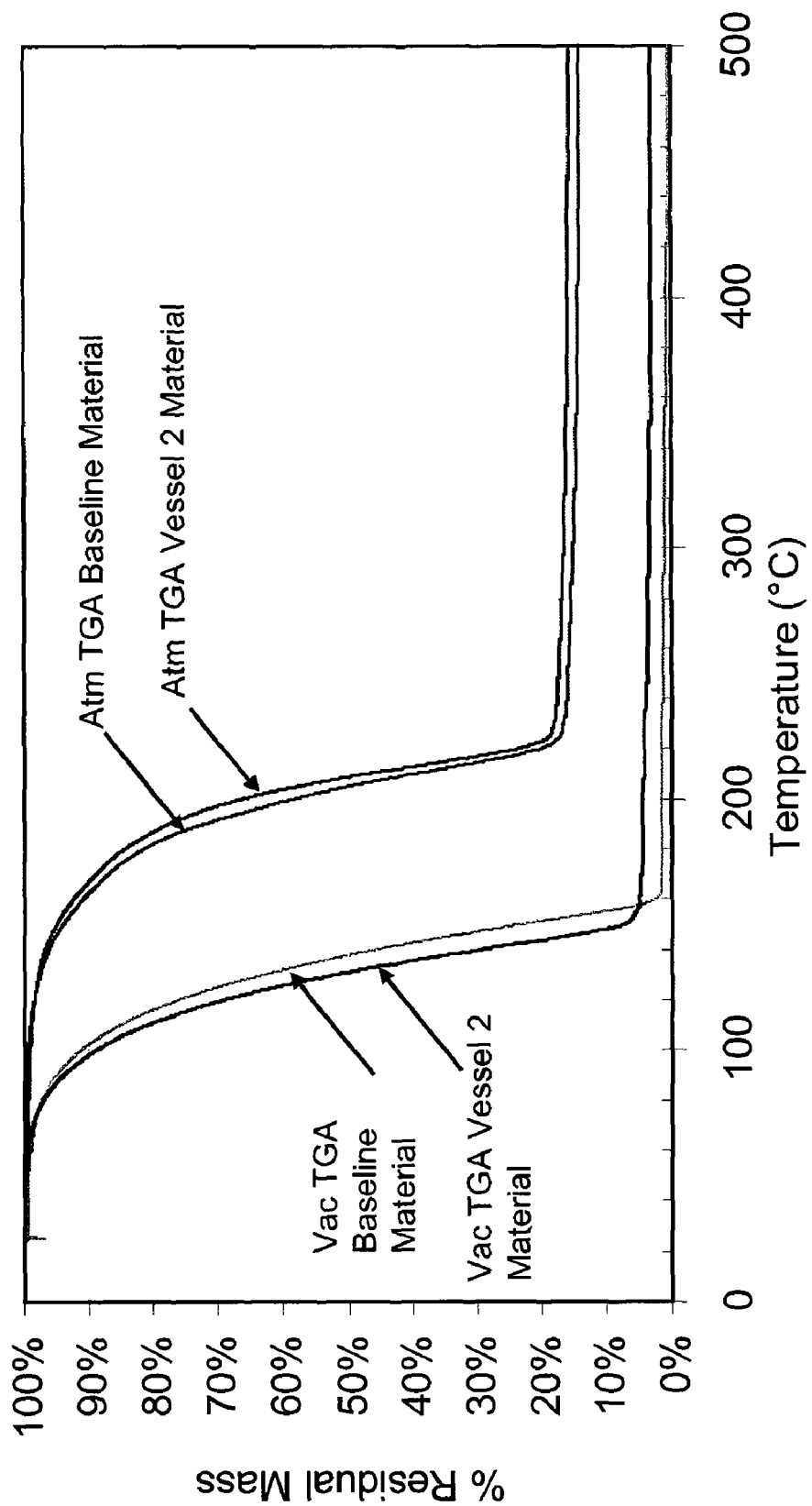
FIG. 5 illustrates experimental data, as obtained according to one embodiment of the current invention.

The results of the sample from vessel 2 in Example 4, were compared to those obtained as the PDMAT baseline material in Example 1. FIG. 5 shows graphically the results, which are interpreted to show that even after 2 days of continuous treatment, the sample in vessel 2 (i.e. glass lined) exhibits similar properties as those in the baseline sample.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method for storing a precursor which decreases the precursor decomposition rate, said method comprising:
    a) providing a vessel comprising an outer surface made of stainless steel and an inner surface made of a second material, wherein the vessel defines an internal volume and wherein the outer surface material is not the same as the inner surface material;
    b) introducing a precursor into the vessel; wherein:
       i) the precursor is of the general formula:

Ta(NR$^1$R$^2$)$_x$ 

wherein
          R$^1$ and R$^2$ are independently selected from C1-C4 alkyl groups; and
          x is 4 or 5; and
       ii) at least part of the precursor is in direct physical contact with at least part of the inner surface;
    c) heating the vessel to a temperature between about 60° C. and about 150° C.; and
    d) withdrawing at least part of the precursor from the vessel.

2. The method of claim 1, further comprising withdrawing at least part of the precursor from the vessel, wherein the amount of precursor in the vessel has decomposed less than 7.0%, by weight, between the time the precursor is introduced into the vessel, and the time the precursor is withdrawn from the vessel.

3. The method of claim 2, further comprising withdrawing at least part of the precursor from the vessel, wherein the amount of precursor in the vessel has decomposed less than 5%, by weight, between the time the precursor is introduced into the vessel, and the time the precursor is withdrawn from the vessel.

4. The method of claim 3, further comprising withdrawing at least part of the precursor from the vessel, wherein the amount of precursor in the vessel has decomposed less than 1%, by weight, between the time the precursor is introduced into the vessel, and the time the precursor is withdrawn from the vessel.

5. The method of claim 2, further comprising allowing at least 14 days to pass between the time when the precursor is introduced into the vessel, and the time when the precursor is withdrawn from the vessel.

6. The method of claim 1, further comprising introducing a carrier gas to the vessel.

7. The method of claim 6, wherein the carrier gas is at least one member selected from the group consisting of: nitrogen, argon, helium, dimethylamine (DMA), diethylamine (DEA), and mixtures thereof.

8. The method of claim 7, further comprising introducing a carrier gas into the vessel to aid in withdrawing the precursor.

9. The method of claim 7, further comprising introducing the carrier gas into the vessel to act as a head gas for storage of the precursor in the vessel.

10. The method of claim 1, further comprising withdrawing the precursor at a pressure between about 1 mTorr and about 760 Torr.

11. The method of claim 10, further comprising withdrawing the precursor at a pressure between about 1 Torr and about 10 Torr.

12. The method of claim 11, further comprising withdrawing the precursor at a pressure of about 0.5 Torr.

13. The method of claim 1, further comprising heating the vessel to a temperature between about 60° C. and about 100° C.

14. The method of claim 13, further comprising heating the vessel to a temperature of about 75° C.

15. The method of claim 1, wherein the precursor comprises at least one of: pentakis(dimethyl)amino tantalum (PDMAT), pentakis(diethlyamino) tantalum (PDEAT), and pentakis(N-methlyethylamino) tantalum (PEMAT).

16. The method of claim 1, wherein the inner surface material comprises at least one member selected from the group consisting of: glass, silicon, silicon dioxide, silicon carbide, quartz, titanium oxide, titanium nitride PFTE, tantalum oxide, and tantalum nitride.

17. The method of claim 1, further comprising providing a plurality of storage surfaces disposed within the internal volume of the vessel; and introducing the precursor such that at least part of the precursor is in direct physical contact with at least part of the storage surfaces, wherein, the storage surfaces are made of a material different from that of the outer surface material.

18. The method of claim 1, wherein the vessel comprises a bubbler type vessel.

19. The method of claim 1, wherein the vessel comprises a precursor storage container.

* * * * *